United States Patent [19]
Keigo

[11] Patent Number: 5,627,096
[45] Date of Patent: May 6, 1997

[54] MANUFACTURING METHOD OF ELECTRIC CHARGE TRANSFERRING DEVICES

[75] Inventor: Yukihide Keigo, Kagoshima, Japan

[73] Assignee: Sony Corporation, Tokyo, Japan

[21] Appl. No.: 590,178

[22] Filed: Jan. 23, 1996

[30] Foreign Application Priority Data

Jan. 25, 1995 [JP] Japan .................................. 7-030033

[51] Int. Cl.$^6$ .................................................. H01L 21/70
[52] U.S. Cl. .......................... 438/144; 438/587; 438/75
[58] Field of Search .................................. 437/53, 40, 41, 437/43, 50, 61, 69, 72

[56] References Cited

U.S. PATENT DOCUMENTS

| | | | |
|---|---|---|---|
| 5,369,040 | 11/1994 | Halvis et al. | 437/53 |
| 5,434,097 | 7/1995 | Shin et al. | 437/53 |
| 5,457,332 | 10/1995 | Blanchard | 437/53 |

Primary Examiner—Tuan H. Nguyen
Attorney, Agent, or Firm—Hill, Steadman & Simpson

[57] ABSTRACT

A resist layer with a pattern having openings on portions exposed to boundaries between any two adjacent transfer gate electrodes is formed on the surface of a polycrystal silicon layer used as a material for forming the transfer gate electrodes which polycrystal silicon layer has been formed on a gate insulating layer. The polycrystal silicon layer is then etched with the resist layer used as a mask and the surface of the polycrystal silicon layer is subsequently oxidized to form silicon oxide layers between any two adjacent transfer gate electrodes for insulating the adjacent transfer gate electrodes from each other. In this way, the number of manufacturing processes can be reduced by preventing a potential pocket, which gives rise to signal charge left untransferred beneath the space between any two adjacent transfer gate electrodes, from being developed while forming the transfer gate electrodes of the electric charge transferring device into a single-layer structure. As a result, the cost of manufacturing an electric charge transferring device can be reduced and, at the same time, the non-uniformity of the thickness of the gate insulating layers beneath the transfer gate electrodes can be avoided.

8 Claims, 6 Drawing Sheets

FIG. IA
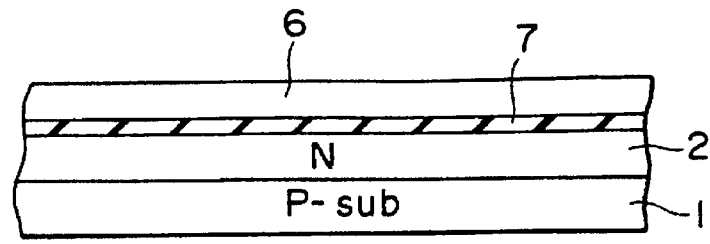
FIG. IB
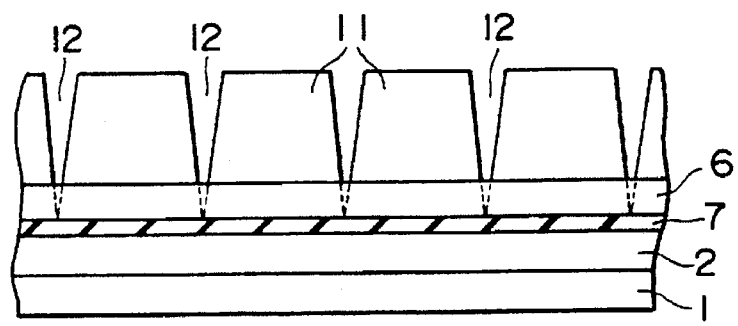
FIG. IC
THE POLY-CRYSTAL SILICON LAYER DOES NOT HAVE TO BE ETCHED FULLY.
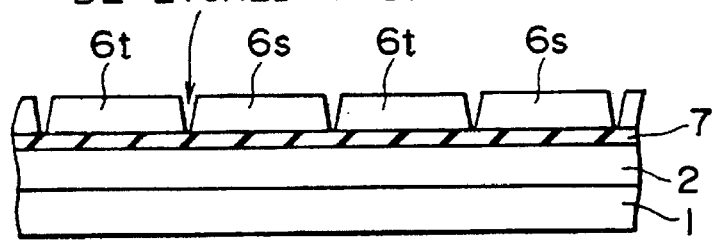
FIG. ID
ISOLATED BY OXIDATION EVEN IF NOT ETCHED FULLY.
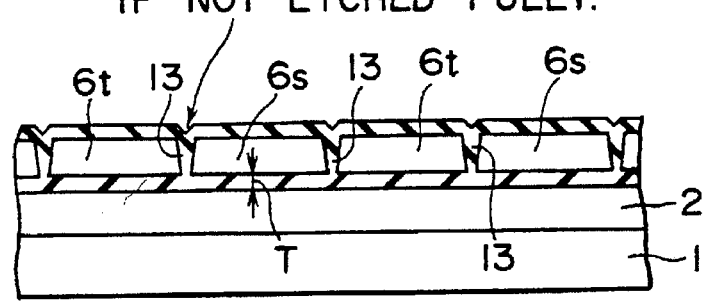

F I G. 3A
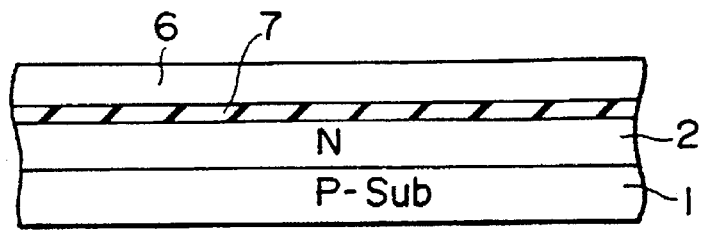
F I G. 3B
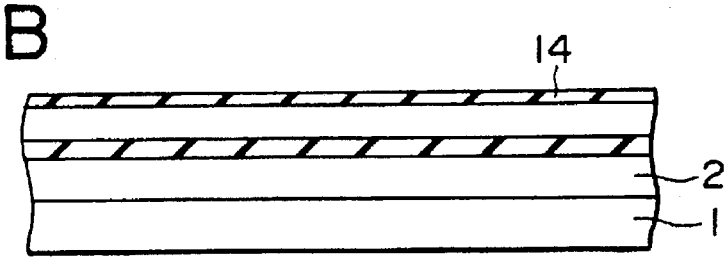
F I G. 3C
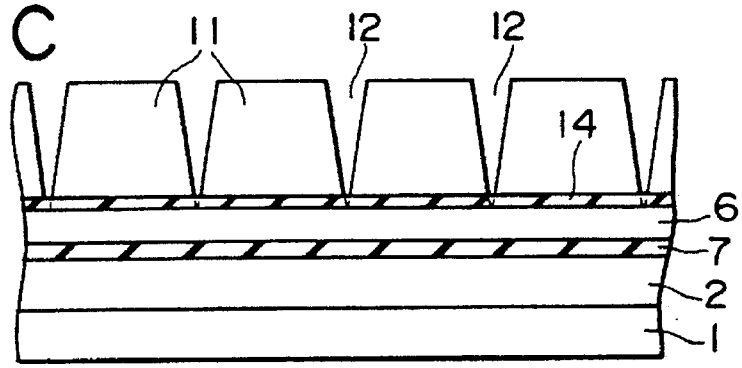
F I G. 3D
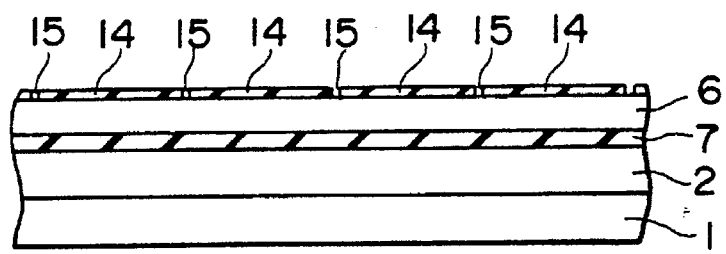
F I G. 3E
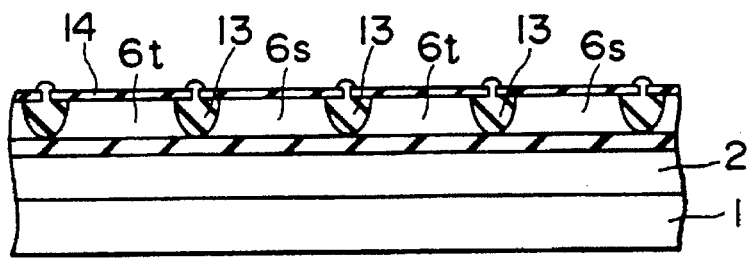

POTENTIAL POCKET (LARGE)
(HERE, SIGNAL CHARGE IS LEFT UNTRANSFERRED)

POTENTIAL

POTENTIAL POCKET (SMALL)

POTENTIAL

MANUFACTURING METHOD OF ELECTRIC CHARGE TRANSFERRING DEVICES

BACKGROUND OF THE INVENTION

1. Field of the Invention

In general, the present invention relates to a method for manufacturing electric charge transferring devices. In particular, the present invention relates to a method for manufacturing electric charge transferring devices which method allows transfer gate electrodes to be formed into a single-layer structure.

2. Description of the Related Art

FIGS. 4A to 4C are diagrams relevant to a typical conventional electric charge transferring device. FIG. 4A is a cross-sectional diagram and FIG. 4B is a potential diagram used for explaining transferring operations. FIG. 4C is a pulse diagram showing driving clock pulses for the transferring operations. A manufacturing method of this typical electric charge transferring device is adopted for manufacturing electric charge transferring devices of a two-phase transferring system, many of which devices are used as horizontal registers employed in a CCD type solid-state video photographing apparatus.

Reference numeral 1 shown in the figures is a P-type semiconductor substrate whereas reference numeral 2 is an N-channel layer formed on the surface of the semiconductor substrate 1. Reference numerals 3 are N-type transfer portions which are laid out on the surface of the N-channel layer 2 in the transfer direction at locations separated from each other by a predetermined distance. The N-type transfer portions 3 are formed by selectively doping the N-channel layer 2 with P-type impurities. Reference numerals 4 are each a region of the N-channel layer 2 on the transfer destination side of the transfer portion 3 which region forms a storage portion. As a matter of fact, the storage regions 4 are portions of the N-channel layer 2 which are not doped with the P-type impurities described above. In other words, the storage regions 4 can be said to be the N-channel layer 2 as it is.

Reference numeral 5 is a gate insulating layer formed on the surface of the semiconductor. Reference numerals 6s, 6t, 6s, 6t, ... etc. are transfer gate electrodes made of polycrystal silicon. The transfer gate electrodes 6s, 6s, ... are made of a first silicon layer located on the storage portions 4, 4, ... The transfer gate electrodes 6t, 6t ... are, on the other hand, made of a second silicon layer located on the transfer portions 3, 3, ... It should be noted that reference numeral 7 is an insulating layer whereas reference numeral 8 is an interlayer insulating layer.

FIG. 3C shows two-phase driving pulses φ1 and φ2. The principle of the transfer operation is explained below by paying attention to, for example, a pair of transfer gate electrodes 6t and 6s to which the driving pulse φ1 is applied.

In other words, the driving pulse φ1 is applied to the transfer gate electrode 6t on one of the transfer portions 3 and the transfer gate electrode 6s forming a pair in conjunction with the transfer gate electrode 6t on the storage portion 4 on the transfer destination side of the transfer portion 3. By selective ion injection of P-type impurities into the transfer portion 3, the N-type impurity concentration of the transfer portion 3 can be made lower than that of the storage portion 4. Accordingly, a difference in potential of the order of 2 to 3 V between the transfer portion 3 and the storage portion 4 is developed even if the same voltage is applied. As a result, the storage portion 4 has a deeper potential. For this reason, electric charge is probably transferred through the transfer portion 3 and collected at the storage portion 4.

At a point of time t=t1, one of the driving clock pulses φ1 is raised to a high-level voltage (of 5 V in the case of this example) while the other driving clock pulse φ2 goes down to a low-level voltage (of 0 V in this example). At that time, the regions below the transfer gate electrodes 6s, 6s,—made from the first silicon layer, that is, the transfer portions 4, 4,—enter a state of signal charge being accumulated.

Later on, the time lapses, arriving at a point of time t=t3 after passing a point of time t=t2. With this lapse of time, the phases of the driving clock pulses φ1 and φ2 are inverted and, as shown in FIG. 4B, the signal charge is transferred in the direction to the right shown in the figure.

By the way, one of reasons why the transfer gate electrodes 6s, 6t, 6s, 6t, ... are built into a multi-layer structure as shown in FIG. 4A is to make any two adjacent transfer gate electrodes 6s and 6t overlap each other. In this way, no potential pocket is made below a space between two adjacent gate insulating layers. In this example, the multi-layer structure comprises two layers. It should be noted, however, that the structure may comprise three layers. That is to say, if the transfer gate electrodes 6s, 6t, 6s, 6t, ... are formed from a single polycrystal silicon layer by means of the conventional technology, the gap between two adjacent transfer gate electrodes 6s and 6t inevitably increases as shown in FIG. 5A. In this case, a region on which the effect of the magnetic field generated by the transfer electrodes decreases is developed beneath a space between the two adjacent transfer gate electrodes 6s and 6t. As a result, a potential pocket like the one shown in FIG. 5B is developed between any two adjacent transfer gate electrodes. Since the potential pocket can become a place for electric charge to accumulate, some electric charge is left untransferred.

For this reason, according to the conventional technology, the transfer gate electrodes . . . are built into a two-layer structure so as to make any two adjacent transfer gate electrodes overlap each other. FIGS. 6A and 6B are diagrams used for explaining why the transfer gate electrodes are formed into a two-layer structure. FIG. 6A is a cross-sectional diagram whereas FIG. 6B is a potential diagram.

That is to say, by forming a two-layer structure, any two adjacent transfer gate electrodes can be built to overlap each other. In such a structure, the reduction in effect of the electric field on the channel between two adjacent transfer gate electrodes is decreased. In its turn, the potential pocket decreases in size as shown in FIG. 6B. As a result, the amount of signal charge left untransferred due to the potential pocket also decreases as well.

FIGS. 7A to 7G are cross-sectional diagrams showing an order of processes of a method for forming transfer gate electrodes into a multi-layer structure.

(A) As shown in FIG. 7A, after a gate insulating layer 7 is formed on the surface of a channel 2, a first polycrystal silicon layer 6a is formed on the gate insulating layer 7.

(B) Next, as shown in FIG. 7B, resist layers 9 are formed selectively on the first polycrystal silicon layer 6a. The resist layers 9 are formed so as to cover storage portions which are not shown in FIG. 7.

(C) Next, transfer gate electrodes 6s, 6s, ... are formed by etching the polycrystal silicon layer 6a using typically the RIE technique with the resist layers 9 used as a mask. Later on, the polycrystal silicon layer 6a is removed. A state with the polycrystal silicon layer 6a removed is shown in FIG. 7C. It should be noted that the surfaces of exposed portions on the gate insulating layer 7 are slightly etched by the RIE technique. (D) Next, as shown in FIG. 7D, interlayer insulating layers 8 are formed by thermally oxidizing the surface of the polycrystal silicon layer 6a. It should be noted that, at that time, a silicon oxide layer grows on the gate insulating layer 7 so that the gate insulating layer 7, which once became thin in the previous process (C), returns approximately to a predetermined thickness.

(E) Next, as shown in FIG. 7E, a second polycrystal silicon layer 6b is formed by means of the CVD technique.

(F) Next, as shown in FIG. 7F, resist layers 10 are formed selectively on the polycrystal silicon layer 6b. To put it in more concrete terms, the resist layers 10 are formed so as to cover regions at which transfer gate electrodes 6t for driving the transfer portions, not shown in FIG. 7, are to be formed.

(C) Next, transfer gate electrodes 6t, 6t, ... are formed by etching the polycrystal silicon layer 6b using typically the RIE technique with the resist layers 10 used as a mask. Later on, the resist layers 10 are removed. A state with the resist layers 10 removed is shown in FIG. 7G.

At the end of the process (G), the creation of the transfer gate electrodes into a multi-layer structure is completed.

Problems to be Solved by the Invention

By the way, according to the conventional method of manufacturing electric charge transferring devices, a multi-crystal silicon layer is first formed and transfer gate electrodes are then formed by patterning in an etching process which uses resist layers selectively formed as a mask. It is necessary to repeat these process a plurality of times. On the top of that, a process to forme an interlayer insulating layer by thermal oxidation on the surfaces of the transfer gate electrodes made from the polycrystal silicon layer is also required, giving rise to problems that the number of manufacturing processes increases and the manufacturing cost also becomes higher as well.

In addition, as the number of manufacturing processes increases, the yield is inevitably decreased. The decreased yield also becomes one of the causes of the rising manufacturing cost.

Furthermore, the above conventional method of manufacturing electric charge transferring devices also has a problem that there is a difference in magnitude between the thickness T1 of the gate insulating layer 7 beneath the transfer gate electrode 6s made from the first polycrystal silicon layer and the thickness T2 of the gate insulating layer 7 beneath the transfer gate electrode 6t made from the second polycrystal silicon layer. This problem is not desirable because it gives rise to a trouble in that there is a difference in electric field effect caused by the same gate voltage between the storage and transfer portions. This problem is caused by the following processes. After the gate insulating layer 7 has been formed, the thickness of the layer of the exposed portion is decreased by the etching carried out at the process (C). Later on, at the next process (D), the thermal oxidation is carried out, causing a silicon oxide layer to grow at the exposed portion. The thickness of the layer at the exposed portion thus increases. However, it is extremely difficult to make the decrease in layer thickness resulting from the RIE process equal to the increase in layer thickness gained during the thermal oxidation.

SUMMARY OF THE INVENTION

By the way, in an attempt to grope for solutions to the problems described above, the inventor of the present invention has discovered that the effect of overlapping adjacent transfer gate electrodes on the reduction of the amount of electric charge left untransferred decreases considerably. This is because the length L of the transfer gate electrode and the thickness of the silicon oxide layer between transfer gate electrodes decrease substantially due to the fact that the CCD solid-state photographing device produced in recent years has a drastically reduced size and has an increased picture element count.

In concrete terms, the inventor has discovered that there is all but no difference in effect of preventing electric charge from being left untransferred between the overlapping and non-overlapping structures in the case of an electric charge transferring device like the one shown in FIG. 3 which electric charge transferring device has components with the following dimensions: transfer gate electrodes with a length of 1.2 microns and a silicon oxide layer between transfer gate electrodes having a thickness of 100 nm.

Therefore, the inventor became aware of the fact that the problem of electric charge left untransferred can be solved, that is, almost all the electric charge can be prevented from being left untransferred even in a single-layer or non-overlapping structure if adjacent transfer gate electrodes can be isolated from each other by a thin silicon oxide layer. The inventor then searched for and thought of a technique for forming an extremely thin polycrystal silicon layer between adjacent transfer gate electrodes, leading to the present invention as a result.

In other words, with the present invention, an attempt is made to reduce the number of manufacturing processes by preventing a potential pocket, which gives rise to electric charge left untransferred beneath the space between any two adjacent transfer gate electrodes, from being developed while forming transfer gate electrodes of the electric charge transferring device into a single-layer structure.

In this way, the cost of manufacturing an electric charge transferring device can be reduced and, at the same time, the non-uniformity of the thickness of the gate insulating layers beneath the transfer gate electrodes can be avoided in order to achieve an object of the present invention to make the effect of the same voltage of the transfer gate electrodes on the channel uniform.

With a method of manufacturing electric charge transferring devices according to claim 1, silicon oxide layers for isolating any two adjacent transfer gate electrodes from each other are formed between any two adjacent transfer gate electrodes by performing the steps of:

forming a polycrystal silicon layer to serve as a material for forming the transfer gate electrodes on a gate insulating layer;

forming a mask layer on the polycrystal silicon layer with a pattern having openings on portions exposed to boundaries between any two adjacent transfer gate electrodes;

etching the polycrystal silicon layer with the mask layer used as a mask; and oxidizing the surface of the polycrystal silicon layer.

With a method of manufacturing electric charge transferring devices according to claim 2, silicon oxide layers for isolating any two adjacent transfer gate electrodes from each other are formed between any two adjacent transfer gate electrodes by performing the steps of:

forming a polycrystal silicon layer to serve as a material for forming the transfer gate electrodes on a gate insulating layer;

forming an oxidation-proof layer on the polycrystal silicon layer;

forming a mask layer on the oxidation-proof layer with a pattern having openings on portions exposed to boundaries between any two adjacent transfer gate electrodes;

etching the oxidation-proof layer with the mask layer used as a mask; and oxidizing the surface of the polycrystal silicon layer through openings formed on the oxidation-proof layer at the etching step.

The method of manufacturing electric charge transferring devices according to claim 1 comprises the steps of:

forming a mask layer on the polycrystal silicon layer with a pattern having openings on portions exposed to boundaries between any two adjacent transfer gate electrodes;

etching the polycrystal silicon layer with the mask layer used as a mask; and oxidizing the surface of the polycrystal silicon layer, allowing any two adjacent transfer gate electrodes to be insulated from each other by a silicon oxide layer formed at the oxidizing step.

In addition, by reducing the width of each opening formed on the mask layer by means of the contemporary lithography technology, it is possible to forme a silicon oxide layer with a reduced thickness between any two adjacent transfer gate electrodes for insulating the two adjacent transfer gate electrodes.

As a result, almost all potential pockets can be prevented from being developed even in the case of transfer gate electrodes formed in a single-layer structure, allowing the number of processes to manufacture an electric charge transferring device to be reduced substantially.

In addition, once a gate insulating layer is formed, at least portions beneath the transfer gate electrodes are neither etched nor oxidized to grow. Accordingly, the thickness does not vary non-uniformly. As a result, the effect of the electric field generated by the same voltage of the transfer gate electrodes on the channel can be made uniform.

The method of manufacturing electric charge transferring devices according to claim 2 includes the steps of:

forming an oxidation-proof layer on the surface of a polycrystal silicon layer after the step of forming the polycrystal silicon layer and prior to the step of forming a mask layer; and etching the oxidation-proof layer with the mask layer used as a mask, allowing openings to be formed on the oxidation-proof layer above the gap between any two adjacent transfer gate electrodes. Then, the surface of the polycrystal silicon layer is oxidized through the openings formed on the oxidation-proof layer at the etching step, allowing any two adjacent transfer gate electrodes to be insulated from each other by a silicon oxide layer formed during the oxidization.

On the top of that, by reducing the width of each opening formed on the mask layer by means of the contemporary lithography technology, it is possible to forme a silicon oxide layer with a reduced thickness between any two adjacent transfer gate electrodes for insulating the two adjacent transfer gate electrodes.

As a result, almost all potential pockets can be prevented from being developed even in the case of transfer gate electrodes formed in a single-layer structure, allowing the number of processes to manufacture an electric charge transferring device to be reduced substantially.

In addition, once a gate insulating layer is formed, at least portions beneath the transfer gate electrodes are neither etched nor oxidized to grow. Accordingly, the thickness does not vary non-uniformly. As a result, the effect of the electric field generated by the same voltage of the transfer gate electrodes on the channel can be made uniform.

On the top of that, an oxidation-proof layer is formed on the surface of the polycrystal silicon layer used as a material for forming the transfer gate electrodes in such a way that the oxidation-proof layer covers the upper surfaces of the transfer gate electrodes. In this way, the oxidation processing is carried out with the upper surfaces of the transfer gate electrodes covered by the oxidation-proof layer, allowing the upper surface of the polycrystal silicon layer, which is used as a material for forming the transfer gate electrodes, to be prevented from being oxidized by the oxidation for forming a silicon oxide layer used for insulating any two adjacent transfer gate electrodes from each other. On the top of that, it is also possible to prevent the thickness of the transfer gate electrodes from being reduced by the oxidation.

BRIEF DESCRIPTION OF THE DRAWINGS

FIGS. 1A to 1D are cross-sectional diagrams showing a first embodiment implementing a method for manufacturing electric charge transferring devices in accordance with the present invention in terms of a process order;

FIG. 2A shows the transfer of signal charge in the conventional electric charge transferring device with the upper figure showing a cross-sectional diagram of the electric charge transferring device and the lower figure showing a potential diagram;

FIG. 2B shows the transfer of signal charge in the electric charge transferring device manufactured in accordance with the present invention with the upper figure showing a cross-sectional diagram of the electric charge transferring device and the lower figure showing a potential diagram;

FIGS. 3A to 3E are cross-sectional diagrams showing a second embodiment implementing a method for manufacturing electric charge transferring devices in accordance with the present invention in terms of a process order;

FIG. 4A is a cross-sectional diagram;

FIG. 4B is a potential diagram;

FIG. 4C is a pulse diagram showing driving clock pulses;

FIG. 5A is a cross-sectional diagram;

FIG. 5B is a potential diagram;

FIG. 6A is a cross-sectional diagram;

FIG. 6B is a potential diagram; and

DESCRIPTION OF THE PREFERRED EMBODIMENTS

Figure 2A:
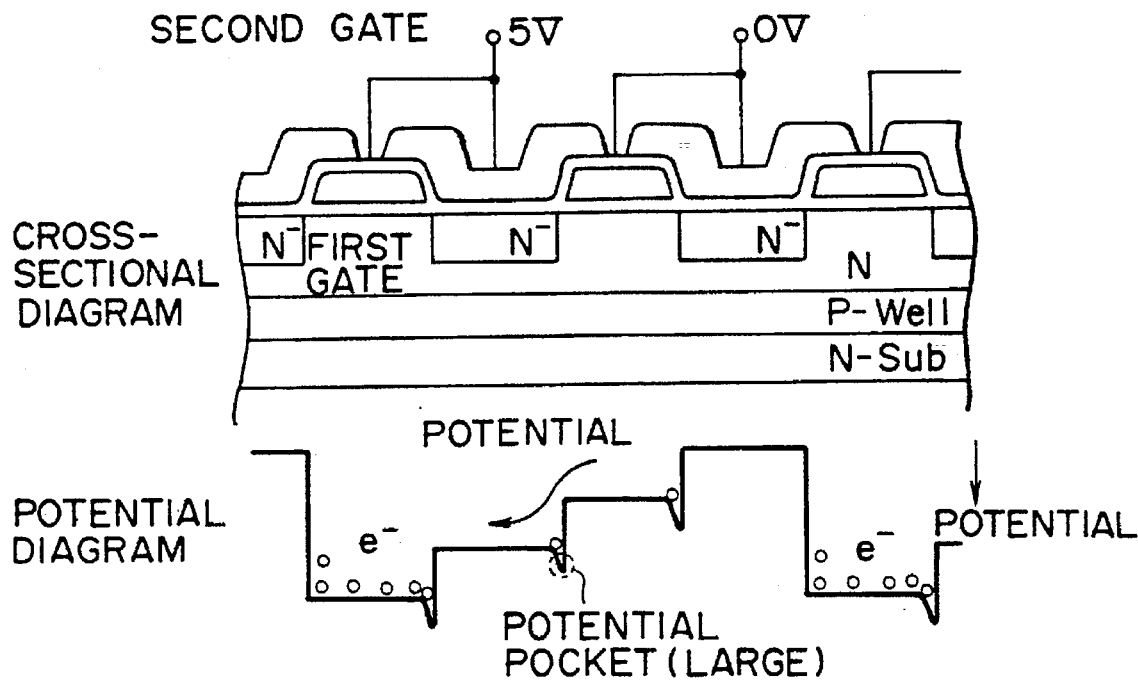
FIGS. 2A and 2B are used for comparing the transfer of signal charge in the conventional electric charge transferring device to that manufactured in accordance with the present invention.

The present invention will become apparent from the following detailed description of preferred embodiments with reference to accompanying diagrams.

FIGS. 1A to 1D show a first embodiment implementing a method for manufacturing electric charge transferring devices in accordance with the present invention in terms of a process order.

(A) After a gate insulating layer 7 is formed on the surface of an N-type embedded channel region 2 formed on a P-type semiconductor substrate 1, a polycrystal silicon layer 6 is formed on the gate insulating layer 7. A state after the creation of the polycrystal silicon layer 6 is shown in FIG. 1A.

(B) Next, as shown in FIG. 1B, a resist layer 11 is formed on the gate insulating layer 7. By exposure and development processes, patterning is then carried out to make a pattern comprising slid-shaped openings 12, 12, . . . located on portions supposed to serve as boundaries among any adjacent transfer gate electrodes. The narrower the openings 12, 12, . . . , the thinner a silicon oxide layer 13 for insulating the transfer gate electrodes which silicon oxide layer is to be formed later on. In addition, since potential pockets can be made smaller in size, the narrow openings 12, 12, . . . can be said to be ideal.

If the width of these openings 12, 12, . . . can be made equal to or smaller than 0.5 microns, the potential pocket can be surely prevented from having a size that may result in electric charge left untransferred. It should be noted that, with the contemporary lithography technology, the width of these openings 12, 12, . . . can be certainly made equal to or smaller than 0.5 microns.

(C) Next, the polycrystal silicon layer 6 is etched with the above resist layer 11 used as a mask. Later on, the resist layer 11 is removed. A state with the resist layer 6 removed is shown in FIG. 1C. It is desirable to adopt the RIE technique with a strong anisotropic characteristic to carry out the etching. This is because, with the RIE technique, the amount of side etching is small and the gap between any two adjacent transfer gate electrodes can be reduced.

The etching results in independent transfer gate electrodes 6s and 6t isolated from each other on the polycrystal silicon layer 6.

It should be noted that the etching does not have necessarily to be a full etching which results in grooves each having the same depth as the thickness of the polycrystal silicon layer 6. In other words, the etching can also be a half etching. The is because, even in the case of a half etching, oxidation in the next oxidation process will proceed in the depth direction of the polycrystal silicon layer 6. As a result, each two adjacent transfer gate electrodes 6s and 6t can be put in a state of being completely isolated from each other by a silicon oxide layer 13 formed by the oxidation.

(D) Next, by putting the transfer gate electrodes 6t, 6s, 6t, 6s, . . . in a thermal oxidation process, a silicon oxide layer 13 to serve as an insulator is formed between any two adjacent transfer gate electrodes 6t and 6s as shown in FIG. 1D.

Later on, a mask having a desired pattern is formed on the transfer gate electrodes. Phosphor ions are then injected selectively to the channel region 2. In addition, by connecting each two adjacent transfer gate electrodes to each other, the creation of an electric charge transferring device like the one shown in FIG. 2B is completed.

With such a method for manufacturing electric charge transferring devices, a resist layer 11 with a pattern having openings 12 on portions exposed to boundaries between adjacent transfer gate electrodes 6s and 6t is formed and the polycrystal silicon layer 6 is then etched with a resist layer 11 used as a mask, allowing independent transfer gate electrodes 6s, 6t, 6s, 6t, . . . almost or completely isolated from each other to be formed.

Later on, the surfaces of transfer gate electrodes 6s, 6t, 6s, 6t, . . . are oxidized in order to insulate the transfer gate electrodes 6s, 6t, 6s, 6t, . . . from each other by means of silicon oxide layers 13, 13, . . . resulting from the oxidation occurring between any two adjacent transfer gate electrodes.

Then, by reducing the width of the openings 12, 12, . . . formed on the resist layer 11 described above typically to 0.5 microns or smaller by adopting the contemporary lithography technology, the insulating silicon oxide layers 13, 13, . . . formed between adjacent transfer gate electrodes can be reduced in size, allowing the potential pocket resulting therefrom to be made smaller than the conventional one.

As a result, almost all potential pockets can be prevented from being developed even in the case of transfer gate electrodes formed in a single-layer structure, allowing the number of processes to manufacture an electric charge transferring device to be reduced substantially.

In addition, once a gate insulating layer is formed, at least portions beneath the transfer gate electrodes 6s, 6t, 6s, 6t, . . . are neither etched nor oxidized to grow. Accordingly, the thickness T does not vary non-uniformly but has a fixed value instead. As a result, the effect of the electric field generated by the same voltage of the transfer gate electrodes on the channel can be made uniform.

Figure 2B:
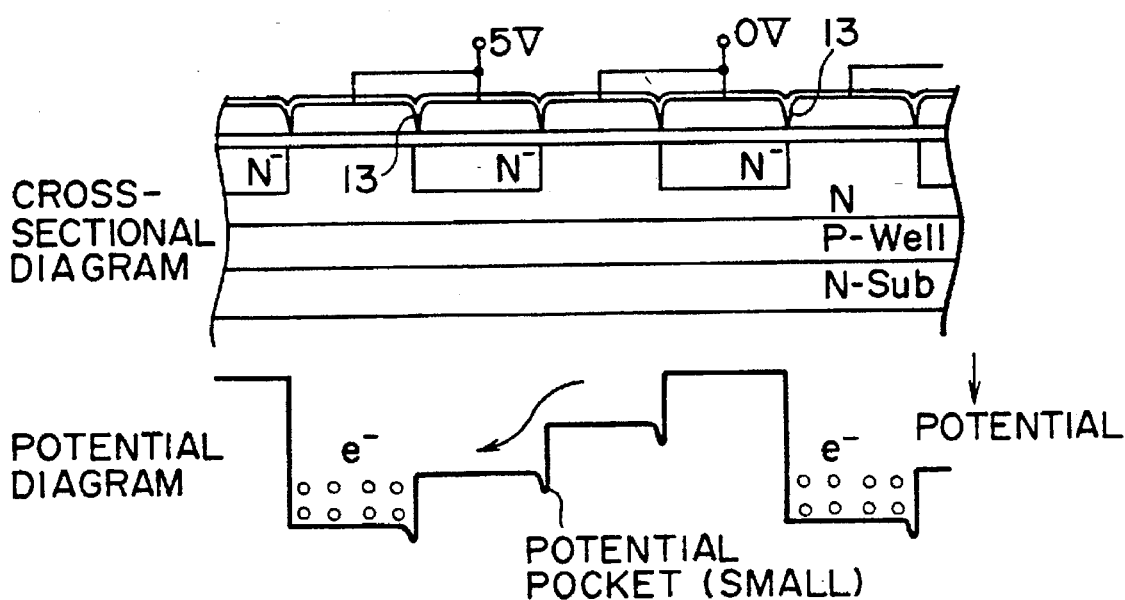
Figure 4A:
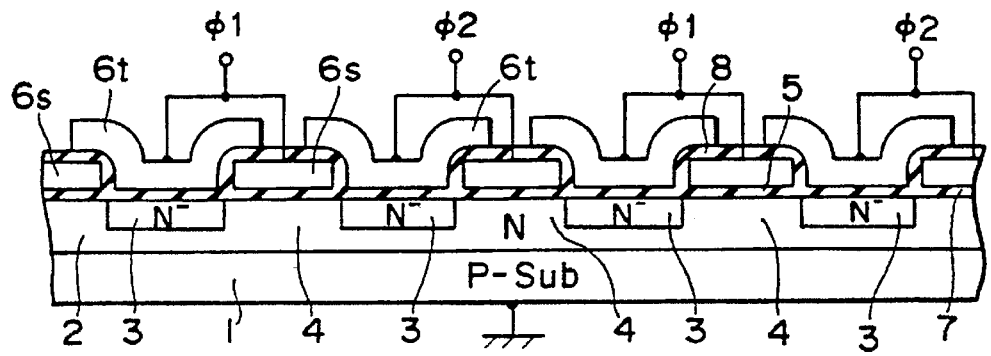
FIGS. 4A to 4C shows an electric charge transferring device used for explaining the technological background of the present invention.
Figure 4B:
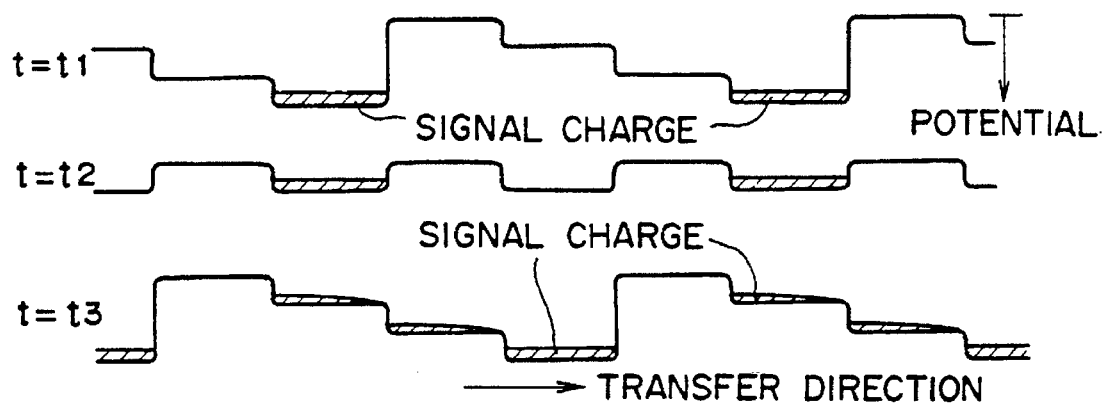
Figure 4C:
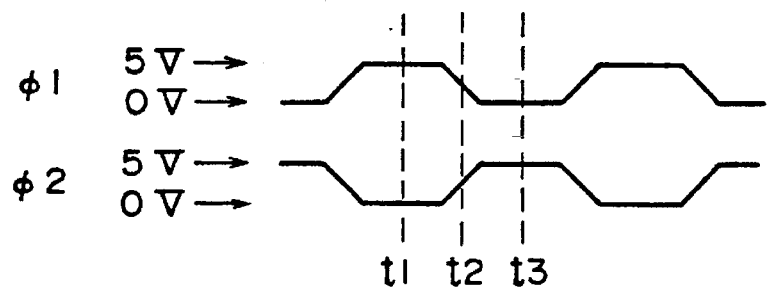
Figure 5A:
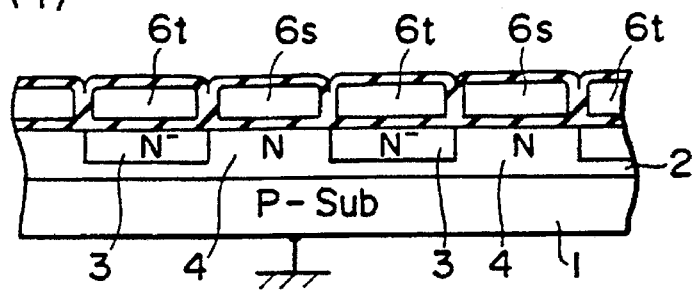
FIGS. 5A and 5B show problems encountered in the creation of transfer gate electrodes from a single polycrystal layer by using the conventional technology.
Figure 5B:
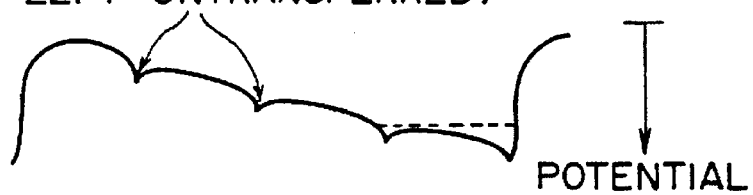
Figure 6A:
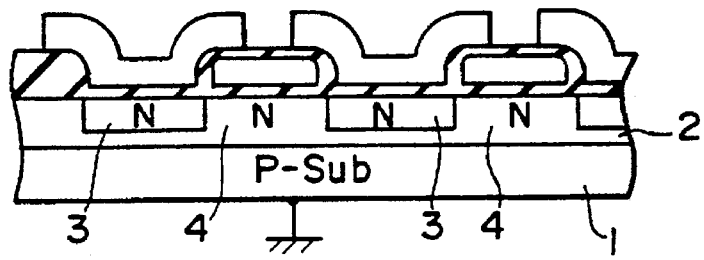
FIGS. 6A and 6B are diagrams used for explaining reasons why transfer gate electrodes in the conventional technology are formed into a multi-layer structure.
Figure 6B:
Figure 7A:
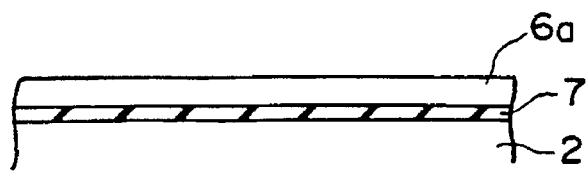
FIGS. 7A to 7G are cross-sectional diagrams showing a typical conventional method for manufacturing electric charge transferring devices in terms of a process order.
Figure 7B:
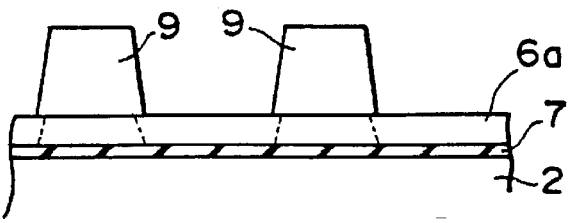
Figure 7C:
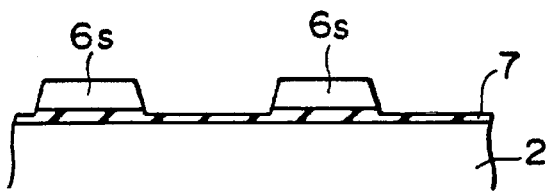
Figure 7D:
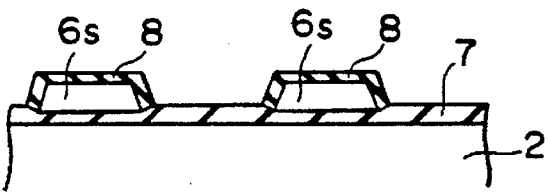
Figure 7E:
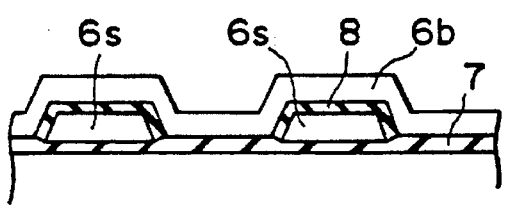
Figure 7F:
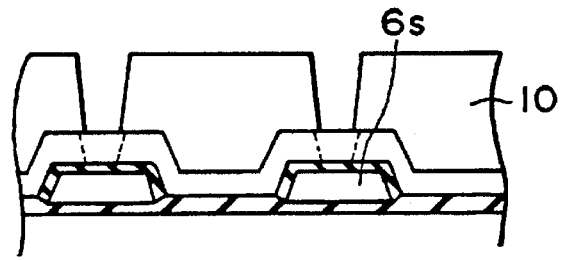
Figure 7G:
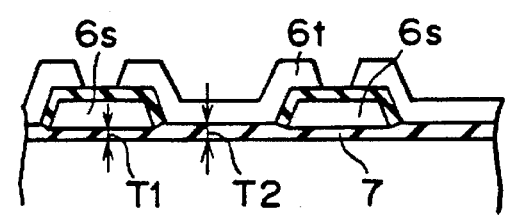

FIGS. 2A and 2B are used for comparing the transfer of signal charge in the conventional electric charge transferring device to that manufactured in accordance with the present invention. FIG. 2A shows the transfer of signal charge in the conventional electric charge transferring device. The upper figure is a cross-sectional diagram of the electric charge transferring device whereas the lower figure is a potential diagram. FIG. 2B shows the transfer of signal charge in the electric charge transferring device manufactured in accordance with the present invention. The upper figure is a cross-sectional diagram of the electric charge transferring device whereas the lower figure is a potential diagram.

It is also obvious from the figures that, in the case of the electric charge transferring device manufactured in accordance with the present invention, the gap between any two adjacent transfer gate electrodes can be substantially reduced by making the silicon oxide layers 13, 13, . . . formed between adjacent transfer gate electrodes for insulating them narrow. Accordingly, the reduction of the effect of the electric field on the channel between two adjacent transfer gate electrodes can be all but eliminated and the potential pocket becomes smaller than the conventional one which is produced by overlapping adjacent transfer gap electrodes each other. As a result, the amount of electric charge left untransferred also becomes smaller than the conventional one.

FIGS. 3A to 3E are cross-sectional diagrams showing a second embodiment implementing a method for manufacturing electric charge transferring devices in accordance with the present invention in terms of a process order.

This embodiment comprises the steps of:

forming an oxidation-proof layer 14 from nitride $Si_3N_4$ on the surface of a polycrystal silicon layer 6 after a process (A) for forming the polycrystal silicon layer 6 typically by means of the CVD technique;

forming a resist layer 11 on the oxidation-proof layer 14;
selectively etching the resist layer 11;
etching the oxidation-proof layer 14 with the selectively etched resist layer 11 used as a mask; and
forming silicon oxide layers 13 to serve as insulators between adjacent transfer gate electrodes 6s, 6t, 6s, 6t, . . . by oxidation of the polycrystal silicon layer 6 through openings 15, 15, . . . formed on the oxidation-proof layer 14 at the above etching step,
so that the thickness of the transfer gate electrodes 6s, 6t, 6s, 6t, . . . can be prevented from being reduced by the oxidation process by virtue of the oxidation-proof layer 14 formed on the polycrystal silicon layer 6. As a result, this embodiment is better than the first embodiment shown in FIG. 1.

(A) After a gate insulating layer 7 is formed on the surface of an N-type embedded channel region 2 formed on a P-type semiconductor substrate 1, a polycrystal silicon layer 6 is formed on the gate insulating layer 7. A state after the creation of the polycrystal silicon layer 6 is shown in FIG. 3A.

(B) Next, as shown in FIG. 3B, an oxidation-proof layer 14 is formed from nitride $Si_3N_4$ on the surface of the polycrystal silicon layer 6 typically by means of the CVD technique.

(C) Next, a resist layer 11 is formed on the oxidation-proof layer 14. By exposure and development processes, patterning is then carried out to make a pattern comprising openings 12, 12, . . . located on portions supposed to serve as boundaries among any adjacent transfer gate electrodes. A state after the patterning is shown in FIG. 3C.

(D) Next, the oxidation-proof layer 14 is etched with the resist layer 11 used as a mask by means of an etching process with a anisotropic characteristic such as the RIE technique in order to forme openings 15, 15, . . . for oxidation purposes. The etching of the oxidation-proof layer 14 must be a full etching instead of a half etching. Later on, the resist layer 11 is removed. A state with the resist layer 11 removed is shown in FIG. 3D.

(E) Next, silicon oxide layers 13, 13, . . . are formed between any two adjacent transfer gate electrodes 6t and 6s for insulating the two adjacent transfer gate electrodes 6t and 6s as shown in FIG. 3E by thermal oxidation of the polycrystal silicon layer 6 through the openings 15, 15, . . . formed on the oxidation-proof layer 14 for oxidation purposes.

With such a method for manufacturing electric charge transferring devices, a resist layer 11 having a pattern comprising openings 12, 12, . . . located above portions exposed to boundaries between any adjacent transfer gate electrodes 6s and 6t is formed on the oxidation-proof layer 14 on the surface of the polycrystal silicon layer 6. Then, openings 15, 15, . . . for oxidation purposes are formed by etching the oxidation-proof layer 14 with the resist layer 11 used as a mask, and the polycrystal silicon layer 6 is oxidized through the openings 15, 15, . . . Accordingly, it is possible to forme independent transfer gate electrodes 6s, 6t, 6s, 6t, . . . completely isolated from each other by virtue of silicon oxide layers 13, 13, . . . which result from the oxidation.

In addition, there is a merit that the thickness of the transfer gate electrodes 6s, 6t, 6s, 6t, . . . can be prevented from being reduced by the oxidation process to forme the silicon oxide layers 13, 13, . . . because of the oxidation-proof layer 14 formed on the polycrystal silicon layer 6.

It is needless to say that there is no fear of the thickness of the gate insulating layer 7 becoming non-uniform as is the case with the first embodiment.

The method of manufacturing electric charge transferring devices according to claim 1 comprises the steps of:
forming a mask layer on the polycrystal silicon layer with a pattern having openings on portions exposed to boundaries between any two adjacent transfer gate electrodes;
etching the polycrystal silicon layer with the mask layer used as a mask; and
oxidizing the surface of the polycrystal silicon layer,
allowing any two adjacent transfer gate electrodes to be insulated from each other by a silicon oxide layer formed at the oxidizing step. In addition, by reducing the width of each opening formed on the mask layer by means of the contemporary lithography technology, it is possible to forme a silicon oxide layer with a reduced thickness between any two adjacent transfer gate electrodes for insulating the two adjacent transfer gate electrodes.

As a result, almost all potential pockets can be prevented from being developed even in the case of transfer gate electrodes formed in a single-layer structure, allowing the number of processes to manufacture an electric charge transferring device to be reduced substantially.

In addition, once a gate insulating layer is formed, at least portions beneath the transfer gate electrodes are neither etched nor oxidized to grow. Accordingly, the thickness does not vary non-uniformly. As a result, the effect of the electric field generated by the same voltage of the transfer gate electrodes on the channel can be made uniform.

The method of manufacturing electric charge transferring devices according to claim 2 includes the steps of:
forming an oxidation-proof layer on the surface of a polycrystal silicon layer after the step of forming the polycrystal silicon layer and prior to the step of forming a resist layer; and
selectively etching the oxidation-proof layer,
allowing openings to be formed on the oxidation-proof layer above the gap between any two adjacent transfer gate electrodes. Then, the surface of the polycrystal silicon layer is oxidized through the openings formed on the oxidation-proof layer at the etching step, allowing any two adjacent transfer gate electrodes to be insulated from each other by a silicon oxide layer formed during the oxidization. On the top of that, by reducing the width of each opening by means of the contemporary lithography technology, it is possible to forme a silicon oxide layer with a reduced thickness between any two adjacent transfer gate electrodes for insulating the two adjacent transfer gate electrodes.

As a result, almost all potential pockets can be prevented from being developed even in the case of transfer gate electrodes formed in a single-layer structure, allowing the number of processes to manufacture an electric charge transferring device to be reduced substantially.

In addition, once a gate insulating layer is formed, at least portions beneath the transfer gate electrodes are neither etched nor oxidized to grow. Accordingly, the thickness does not vary non-uniformly. As a result, the effect of the electric field generated by the same voltage of the transfer gate electrodes on the channel can be made uniform.

On the top of that, an oxidation-proof layer is formed on the surface of the polycrystal silicon layer used as a material for forming the transfer gate electrodes in such a way that the oxidation-proof layer covers the upper surfaces of the transfer gate electrodes. In this way, the oxidation process is carried out with the upper surfaces of the transfer gate electrodes covered by the oxidation-proof layer, allowing the upper surface of the polycrystal silicon layer used as a material for forming the transfer gate electrodes to be prevented from being oxidized by the oxidation for forming a silicon oxide layer used for insulating any two adjacent transfer gate electrodes from each other. On the top of that, it is also possible to prevent the thickness of the transfer gate electrodes from being reduced by the oxidation.

What is claimed is:

1. A method of manufacturing electric charge transferring devices comprising a plurality of transfer gate electrodes formed on a gate insulating layer on a semiconductor substrate by carrying out processes of:

forming said gate insulating layer on a semiconductor region serving as a transfer channel;

forming a conductive layer serving as said transfer gate electrodes on said gate insulating layer;

forming an etching mask layer on said conductive layer, said etching mask layer having openings on portions supposed to serve as boundaries between any two of said adjacent transfer gate electrodes;

etching said conductive layer with said etching mask layer used as a mask; and forming insulating layers between any adjacent two of said transfer electrodes from each other for isolating any adjacent two of said transfer gate electrodes by oxidization of the surface of said conductive layer.

2. A method of manufacturing electric charge transferring devices according to claim 1 wherein, at said process of etching said conductive layer, said conductive layer is fully etched in the depth direction of said conductive layer.

3. A method of manufacturing electric charge transferring devices according to claim 1 wherein, at said process of etching said conductive layer, said conductive layer is partially etched in the depth direction of said conductive layer, leaving some unetched portion.

4. A method of manufacturing electric charge transferring devices according to claim 1 wherein a gap between any adjacent two of said transfer gate electrodes is equal to or smaller than 0.5 microns.

5. A method of manufacturing electric charge transferring devices according to claim 1 wherein, after completing said process of forming insulating layers between any adjacent two of said transfer electrodes from each other for isolating any adjacent two of said transfer gate electrodes, a process of selectively injecting impurities into said channel region below said transfer gate electrodes is carried out.

6. A method of manufacturing electric charge transferring devices comprising a plurality of transfer gate electrodes formed on a gate insulating layer on a semiconductor substrate by carrying out processes of:

forming said gate insulating layer on a semiconductor region serving as a transfer channel;

forming a conductive layer serving as said transfer gate electrodes on said gate insulating layer;

forming an oxidation-proof layer on said conductive layer;

forming an etching mask layer on said oxidation-proof layer, said etching mask layer having openings on portions supposed to serve as boundaries between any two of said adjacent transfer gate electrodes;

forming openings on said oxidation-proof layer by etching said oxidation-proof layer with said etching mask layer used as a mask; and forming insulating layers between any adjacent two of said transfer electrodes from each other for isolating any adjacent two of said transfer gate electrodes by oxidization of said conductive layer through said openings formed on said oxidation-proof layer.

7. A method of manufacturing electric charge transferring devices according to claim 6 wherein a gap between any adjacent two of said transfer gate electrodes is equal to or smaller than 0.5 microns.

8. A method of manufacturing electric charge transferring devices according to claim 6 wherein, after completing said process of forming insulating layers between any adjacent two of said transfer electrodes from each other for isolating any adjacent two of said transfer gate electrodes, a process of selectively injecting impurities into said channel region below said transfer gate electrodes is carried out.

* * * * *